United States Patent
Ling et al.

(10) Patent No.: US 7,687,007 B2
(45) Date of Patent: Mar. 30, 2010

(54) MOLD FOR NANO IMPRINTING

(75) Inventors: Torbjörn Ling, Lund (SE); Lars Montelius, Bjärred (SE); Matthias Keil, Malmö (SE); Marc Beck, Lund (SE)

(73) Assignee: Obducat AB, Malmo (SE)

( * ) Notice: Subject to any disclaimer, the term of this patent is extended or adjusted under 35 U.S.C. 154(b) by 864 days.

(21) Appl. No.: 10/518,475

(22) PCT Filed: Jun. 16, 2003

(86) PCT No.: PCT/SE03/01004

§ 371 (c)(1),
(2), (4) Date: Dec. 20, 2004

(87) PCT Pub. No.: WO04/000567

PCT Pub. Date: Dec. 31, 2003

(65) Prior Publication Data
US 2005/0287820 A1    Dec. 29, 2005

Related U.S. Application Data

(60) Provisional application No. 60/406,931, filed on Aug. 30, 2002.

(51) Int. Cl.
*B29C 33/56* (2006.01)

(52) U.S. Cl. ............... 264/338; 101/401; 106/38.2; 106/38.22; 106/38.27; 148/277; 148/281; 148/284; 249/114.1; 249/115; 249/116; 425/385

(58) Field of Classification Search ............... 425/385, 425/135; 977/877; 728/323; 249/114.1, 249/116, 115; 264/219, 220, 338; 106/38.2, 106/38.22, 38.27; 148/270, 271, 283, 272, 148/277, 281, 284; 101/401, 401.1
See application file for complete search history.

(56) References Cited

U.S. PATENT DOCUMENTS 4,120,995 A * 10/1978 Phipps et al. .......... 427/255.23
5,512,131 A    4/1996 Kumar et al.
(Continued)

FOREIGN PATENT DOCUMENTS

| JP | 4-255307 | 9/1992 |
|---|---|---|
| WO | WO 00/00868 A1 | 1/2000 |
| WO | WO 01/53889 A1 | 7/2001 |
| WO | WO 01/69317 A1 | 9/2001 |

OTHER PUBLICATIONS

R.W. Jaszewski et al., "Properties of thin anti-adhesive films used for the replication of microstructures in polymers," Microelectronic Engineering 35 (1997), pp. 381-384.
(Continued)

*Primary Examiner*—Yogendra Gupta
*Assistant Examiner*—Emmanuel S Luk
(74) *Attorney, Agent, or Firm*—Finnegan, Henderson, Farabow, Garrett & Dunner, L.L.P.

(57) ABSTRACT

Method for manufacturing a mold tool (1), devised for forming a structured nanoscale pattern on an object (24) and having a layer (16) which is anti-adhesive with regard to the object (24). A stamp blank (2) is provided with a structured pattern (4) on a surface (8). The patterned surface (8) is coated with a layer (6) of a metal, which has a stable oxidation number and can form a mechanically stable oxide film. The metal layer (6) is oxidized for forming of an oxide film (10). The oxide film (10) is exposed to a reagent comprising molecule chains (18), each of which has a linkage group (20) which bonds to the oxide film (10) by chemical bonding, wherein the molecule chains (18) either at the outset comprise at least a group (22) comprising fluorine, or in a subsequent step is provided with at least one such group (22).

13 Claims, 1 Drawing Sheet

U.S. PATENT DOCUMENTS

| | | | |
|---|---|---|---|
| 5,772,905 | A | 6/1998 | Chou |
| 6,380,101 | B1 | 4/2002 | Breen et al. |
| 6,419,752 | B1 * | 7/2002 | Shvets et al. ............... 118/720 |
| 6,794,027 | B1 * | 9/2004 | Araki et al. ............... 428/336 |
| 2003/0056855 | A1 * | 3/2003 | Weimer et al. ............. 148/276 |
| 2006/0159909 | A1 * | 7/2006 | Aslan et al. ............... 428/323 |
| 2007/0054057 | A1 * | 3/2007 | Matje et al. ............. 427/421.1 |

OTHER PUBLICATIONS

Ken C. Pohlmann, "The Compact Disc Handbook," $2^{nd}$ edition, A-R Editions Inc., ISBN 0-89579-300-8, p. 277.

Donald M. Mattox (Chapter 3), Rointan F. Bunshah (Chapter 4), and John A. Thornton et al., (Chapter 5), "Handbook of deposition technologies for films and coatings: Science, technology and applications," $2^{nd}$ edition, Noyes Publications, Westwood, NJ, USA 1994, ISBN 0-8155-1337-2.

Hao Lei et al., "Preparation of novel Raney-Ni catalysts and characterization by XRD, SEM and XPS," Applied Catalysis A: General 214 (2001), pp. 69-76.

B.F. Levine, Bond-Charge Calculation of Nonlinear Optical Susceptibilities for Various Crystal Structures, Phys. Rev B7, (1973); pp. 2591-2600.

Rolf Hofer, "Surface Modification for Optical Biosensor Applications," Diss., ETH No. 13873, Zürich 2000.

* cited by examiner

MOLD FOR NANO IMPRINTING

CROSS REFERENCE TO RELATED APPLICATIONS

This application is a national phase application based on PCT/SE2003/001004 and claims the priority of Sweden Patent Application No. 0201917-2, filed on Jun. 20, 2002, and claims the benefit of U.S. Provisional Application No. 60/406,931, filed on Aug. 30, 2002, all of which are incorporated herein by reference in their entirety.

TECHNICAL FIELD

The present invention relates to a method for manufacturing a mold tool to be used for forming a structured nano scale pattern on an object, and which has an anti-adhesive layer with regard to the object.

The invention also relates to a mold tool to be used for forming a structured nano scale pattern on an object and has an anti-adhesive layer with regard to the object.

The present invention also relates to a storage medium such as a CD or DVD or a hard disc.

BACKGROUND

A stamp is often used for the replication of nano scale structures. The stamp imprints a pattern on a plate coated with a layer of a suitable polymer, such as a thermoplastic. In order to avoid that the polymer sticks to the surface of the stamp and contaminates said surface when the stamp is released from the coated plate after the imprint process, it is necessary to provide an anti-adhesive interface surface between the pattern equipped stamp and the polymer. Such an adhesion can also damage the replicated pattern on the plate. A successful imprint thus requires the stamp to be chemically and mechanically stable and to have a low adhesion to polymers.

R. W. Jaszewski et al describes in Microelectronic Engineering 35 (1997) 381-384 that the surface of the stamp can be covered with an ultra-thin, anti-adhesive, layer of PTSE (polytetrafluorethene). The layer is precipitated either by means of plasma polymerisation or ion sputtering from a plasma. The quality of the stamp is reduced when the stamp is used for repeated hobbing according to Jaszewski et al. The layer is obviously not stable enough.

WO 01/53889 describes one way to fasten a monomolecular, anti-adhesive layer on a metal stamp. This method requires that the monomolecular layer comprises a mercapto group capable to bond with the metal stamp and form a metal sulphide.

The above mentioned monomolecular layer is however specifically adapted to a particular surface and requires that the monomolecular layer comprises a mercapto group capable of bonding with the metal stamp and form a metal sulphide. In some applications the monomolecular layer does not have a sufficient adhesion to the surface of the stamp and the respective surface of the form. This may on one hand lead to that the monomolecular layer comes loose from the stamp wherein the stamp must be repaired or discarded and on the other hand lead to that an object, such as a DVD, to which a pattern shall be copied, gets damaged during the transition of the pattern because of adhesion to the stamp.

SUMMARY OF THE INVENTION

The object of the present invention is to eliminate or alleviate the above mentioned drawbacks and to provide a method of manufacturing a mold tool having an anti-adhesive layer which is stable and has good anti-adhesive characteristics. The object is obtained according to the invention by a method of manufacturing a mold tool adapted to be used for forming a structured nano scale pattern on an object and having a layer, which is anti-adhesive with regard to the object, said method comprising the following steps: providing a stamp blank with a structured pattern on a surface, depositing a layer of a metal chosen from titanium, zirconium, niobium, tantalum, and aluminium, and mixtures thereof, on the patterned surface, said metal having a stable oxidation number, oxidising the layer of metal to form a mechanically stable oxide film, and applying at least one reagent on the oxide film, said reagent comprising molecule chains, each having a linkage group, which is chemically bonded with the oxide film wherein the molecule chains either from the beginning comprise at least one group comprising fluorine, or are provided with at least one such group in a subsequent treatment.

Another object of the present invention is to provide a mold tool having an anti-adhesive layer, which is stable and has good anti-adhesive characteristics. This object is obtained by means of a mold tool adapted to be used for forming a structured nano scale pattern on an object, comprising: a stamp blank having a structured pattern on its surface, and an anti-adhesive layer, which is anti-adhesive with regard to the object, comprising molecule chains, each having at least one linkage group and at least one group comprising fluorine, a layer of metal disposed intermediate to the stamp blank and the anti-adhesive layer, the layer of metal comprising at least one of aluminium, zirconium, tantalum, niobium, and titanium, the layer of metal being oxidised to form a mechanically stable oxide film to which the at least one linkage group is chemically bonded.

Another object of the invention is to provide a storage medium, such as an optical storage medium, such as a CD or DVD or a disc with even finer structures, or a magnetical storage medium, such as a hard disc, which medium has a structured pattern which has not been damaged due to adhesion to a mold tool when the structured pattern was produced, wherein the medium is of high quality. This object is obtained according to the invention by means of a storing medium, such as a CD or DVD or hard disc, characterised in that a mold tool according to the above has been used for forming a structured pattern on the medium.

Further advantages and features of the invention are apparent from the description below and the following claims.

BRIEF DESCRIPTIONS OF THE DRAWINGS

The invention will now be described in more detail by way of non-limiting examples, with reference to the accompanying drawings.

DETAILED DESCRIPTION OF PREFERRED EMBODIMENTS

Figure 1:
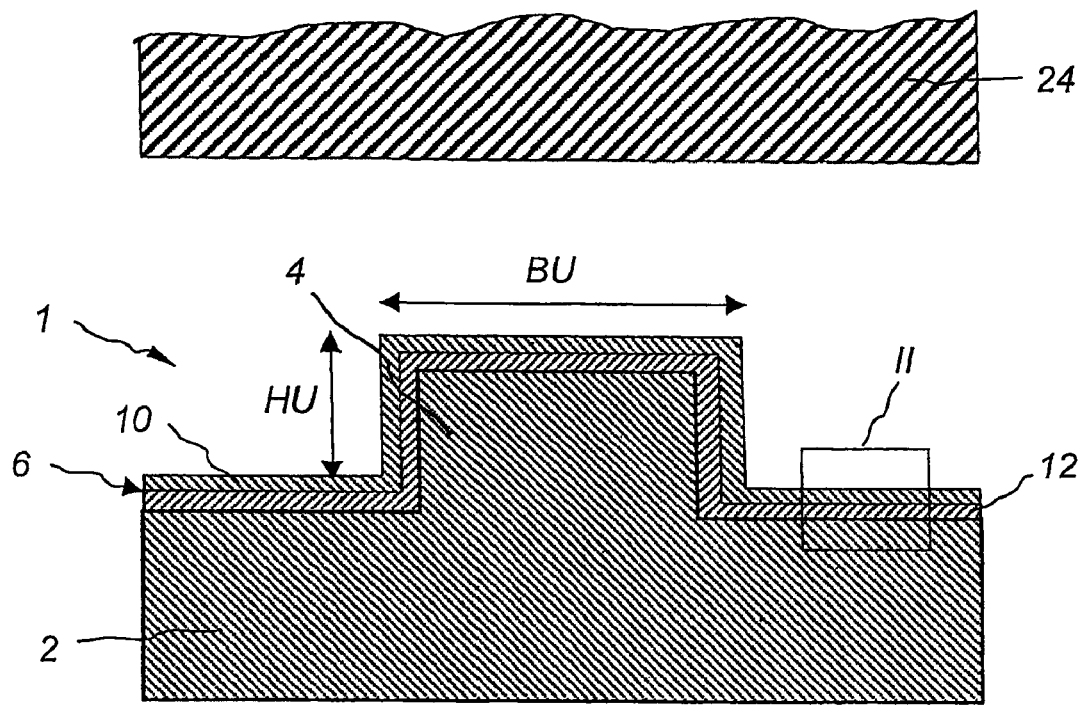
FIG. 1 is a cross-section showing a portion of a nickellic stamp equipped with a metal layer to be used for imprint of DVDs.

An illustrative, non-limiting example of a structured nano scale pattern transfer is nano hobbing lithography, also called nano-imprint lithography, which is a technique for mass production of nano structures. A mold tool in form of a stamp is provided with a nano scale pattern on its surface. The stamp is heated and pressed towards a substrate having a polymer layer wherein the pattern is transferred to the polymer layer. Nano imprint is further described in WO 01/69317 and U.S. Pat. No. 5,772,905. The stamp according to the present invention can also be used in other imprint processes and with or without heating before pressing.

Another example of nano scale pattern transfer is the manufacturing of CDs and DVDs. The method for manufacturing CDs is described e.g. in "The compact disc handbook" by C. Pohlmann, second edition, A-R Editions Inc., ISBN 0-89579-300-8, p. 277. This manufacturing method makes use of a mold in which a board of polycarbonate is molded. A mold tool in form of a nickellic stamp with a pattern is inserted into a wall in the mold to form a desired pattern on the CD or DVD.

The wording "nano scale" shall not be interpreted as to only concern structures in the submicrometer field, e.g. structures with a size of 1-1000 nm. A stamp often has a pattern with structures in both the submicrometer field and structures with a size up to 100 micrometer and larger, such as up to approximately 5 mm. The present invention is suitable for stamps comprising structures in the submicrometer range and/or ranging between 1-100 micrometer. The invention gives the most efficient result for structures in the submicrometer range since these are relatively sensitive to adhesion when the stamp is released.

The wording "monomolecular layer" shall in this description be interpreted as a layer having a thickness corresponding to the length of one molecule. The molecule being integral part of the monomolecular layer is in the present invention elongated and is chemically bonded in one end with a surface. The molecules bonded with the surface have no or only a very low tendency to adhere, chemically or physically, to other molecules or other surfaces.

A stamp to be used for forming a nano scale pattern, which has a very stable and durable anti-adhesive layer, is provided by the present invention. The wording "forming of pattern" can, when used in the present application, mean that the stamp is used for imprinting a pattern into an object, or that the stamp is used as a wall in a mold in which an object, to obtain the pattern, is molded.

In a first step a stamp blank, the surface of which has been provided with a structured pattern in a known manner, e.g. by etching or molding in a mold having a pattern, is used. Suitable materials for the stamp blank are e.g. nickel, chromium, silicon, silicon dioxide, silicon carbide, tungsten oxide, diamond, different polymers, semi-conducting materials, such as GaAs, InP, GaInP, GaInAs, ZnS, and mixtures of these materials. Particularly preferred materials for the manufacturing of a stamp are silicon and nickel, since these materials are easily patterned and have high hardness and are durable. The stamp blank may also comprise a layer of nickel, which has been applied on a base plate of silicon.

The patterned surface of the stamp blank is washed after the patterning, preferably with one or more suitable organical solvents, and dried.

After the wash a thin metal layer is applied on the patterned surface of the stamp blank. The metal layer can preferably be applied by using methods known from other technical fields for the application of thin metal layers on surfaces. Different precipitation methods of metal layers are described e.g. in "Handbook of deposition technologies for films and coatings: Science, technology and applications", edited by Rointan F. Bunshah, second ed., Noyes Publications, Westwood, N.J., USA 1994, ISBN 0-8155-1337-2. The preferred methods for the present invention are coating with evaporated metal in vacuum, which is described in chapter 4 in the above handbook, and sputtering, which is described in chapter 5 in the above handbook. The thickness of the metal layer can be measured by using the methods described in chapter 4 and 5, respectively, in the above handbook.

In case the stamp is being coated with evaporated metal in vacuum, the patterned stamp blank is preferably placed on a rotating plate in an oven, which is evacuated to a pressure of e.g. 1-100 mPa. The stamp blank preferably has a temperature close to room temperature. The oven is thereafter fed with evaporated metal, which condenses on the surface of the stamp blank forming a thin layer. The rotation of the stamp blank during the coating makes the thickness of the layer substantially equal on all portions of the pattern of the stamp blank. The thickness of the metal layer is measured during the coating by using a calibrated, vibrating crystal positioned inside the oven. A metal layer will be deposited also on the crystal, which then obtains a different frequency. The difference in frequency is used as a measure of the thickness of the metal layer.

In case of the metal layer being deposited by means of sputtering, e.g. magnetron sputtering, the stamp blank and a solid piece of the metal forming the layer are placed in a chamber comprising an inert gas, such as argon, at a very low pressure, such as 1-100 mPa. The inert gas is ionised and a magnetron sends inert gas ions, in this case argon ions, towards the metal piece. The argon ions knock out atoms from the surface of the metal piece, which in turn are precipitated on the surface of the stamp blank. When the precipitated metal layer on the surface of the stamp has become thick enough the deposition is concluded and the thereby formed stamp is taken out of the oven and the chamber respectively.

The metal layer shall thereafter be oxidised. The oxidation can either take place spontaneously or be achieved by suitable treatment depending on the metal in question. Spontaneous oxidation can take place by contact with surrounding air, filtered surrounding air, pure oxygen gas or a mixture of oxygen gas and nitrogen gas. A suitable treatment may consist of treating the metal with an oxygen plasma or anodically. Treating a metal surface with an oxygen plasma is described for instance in the above-mentioned "Handbook of deposition technologies.", chapter "Surface preparation for film and coating deposition processes", pages 82-130, especially on pages 108-120.

The metal being an integral part of the metal layer must be such that it forms chemically and mechanically stable oxides, to which an anti-adhesive layer can be bonded, when said metal oxidises. The wording "chemically stable" in this description means that the oxidation number of the oxidised metal must not change at the different pressures, temperatures and chemical conditions present during the manufacturing of the anti-adhesive layer on one hand nor during use of the stamp for nano-imprint lithography or molding on the other. The wording "mechanically stable" means in this description that the oxidised metal must not come loose from the stamp blank or in another way change its form at those pressures and temperatures being present during the manufacturing of the anti-adhesive layer on one hand nor during the use of the stamp for nano-imprint lithography or molding on the other.

The metal should have a stable oxidation number. Metals with a preferred oxidation number substantially only form one type of oxide with a chemically stable oxidation number, which is not altered during the manufacturing of the anti-adhesive layer or during use of the stamp for nano-imprint lithography or during molding of objects with structured nano scale patterns. Some metals may have a catalytical effect, which seems to have an oxidational effect on carbon chains in the anti-adhesive layer at those conditions being present during the above-mentioned use. Examples of metals with probable catalytical effect are platina, Pa, and palladium, Pd, but also to some extent other metals such as nickel, Ni. An indication of this is disclosed in "Preparation of novel Raney-Ni catalysts and characterization by XRD, SEM and XPS", Hao Lei et al, Applied Catalysis A: General 214 (2001) 69-76. Raney-nickel is a sponge-like nickel material having a catalytic effect and can among other things break down hydrocarbon compounds. A structured nano-scale nickel surface can be regarded to have some similarities with Raney-nickel and may therefore have a breakdown effect on a monomolecular layer. The risk is therefore considerable that a monomolecular layer bonded with e.g. a stamp having a nickel surface comes loose from the nickel surface. When a stamp blank is manufactured of many different materials, e.g. a stamp blank manufactured of a metal alloy or a stamp blank manufactured of many different materials, the metal layer will provide the effect that the surface layer gets the same and furthermore predictable characteristics throughout the entire surface of the stamp.

Another important characteristic of the metal layer is that it must have a good adhesive characteristic to the material of the stamp blank in question.

The formed oxide should have good resistance so as to withstand repeated stamping. Even more preferable is that the oxide is so hard that a hard surface layer is formed which is durable and pressure resistant. The hardness of the oxide layer is preferably at least 4 on Moh's scale, even more preferable at least 5.

Metals being specifically suitable for deposition of the surface of the stamp blank are titanium, Ti, zirkonium, Zr, niobium, Nb, tantalum, Ta and aluminium, Al. The monomolecular layer seems to have best adherence with the metal layer if the bond between the molecules and the metal layer has a substantially covalent structure. B. F. Levine has in Phys, Rev B 7, 2591, (1973) made measurements of Phillips-ionicity. According to these measurements the ionicity for NiO is 0.841, for $Al_2O_3$ 0.796 and for $TiO_2$ 0.686. A possible interpretation of these results is that $TiO_2$ has the least ionic characteristic and could therefore give rise to bonds with a more covalent characteristic than NiO. Thus, this could also be an explanation of why a nickel surface is not completely suitable to maintain a monomolecular layer.

Titanium forms stable titanium oxide during contact with surrounding air, which can be in form of $TiO_2$ and/or $TiO(OH)_2$ in different mutual relationships depending on humidity, temperature etc. When the layer of titanium has become dry, as is the case for the below described bonding of an anti-adhesive layer, there is almost only $TiO_2$ in the titanium dioxide. After a short contact with the surrounding air there is almost only quadrivalent, $Ti^{+IV}$ and thus forms a stable oxide, being substantially covalent regarding the bonding characteristic. Zirkonium, Zr, forms in a similar manner stable zirkonium oxide, which can be represented by $ZrO_2$ in which zirkonium has the completely outweighing oxidation number +IV. Niobium, Nb, forms stable $Nb_2O_5$ during contact with surrounding air. Tantalum, Ta, forms stable $Ta_2O_5$ during contact with surrounding air. Tantalum and niobium have in these oxides the oxidation number +V, respectively. Aluminum forms stable aluminium oxide during contact with surrounding air, said aluminium oxide is presumed to be in the form of $Al_2O_3$ in which the aluminum is trivalent, $Al^{+III}$. The metal should form covalent oxides since this often means that the oxide layer gets harder than is the case for ionical oxides. Titanium and aluminium are therefore particularly suitable metals.

In some cases it is appropriate to remove possible oxide from the surface of the stamp blank by treatment in a reducing environment before the metal layer is applied on this surface in order to achieve the best possible adhesion. It seems, however, that some metals, e.g. titanium and aluminium, can react with the oxygen of the oxide of the stamp blank and form a metal layer which has good adhesion to the surface of the stamp blank even if the surface of the stamp blank is not free from oxide when the metal layer is applied.

The thickness of the metal layer should be such that a homogenous and stable oxide layer is formed on the surface of the metal layer while the metal layer is attached to the underlying stamp blank in a stable way. A metal layer being too thick could effect the pattern of the stamp blank so that the desired result would not be obtained when imprinting with the prepared stamp. It is, however, often possible to take into consideration that a metal layer of a certain thickness is to be precipitated on the stamp blank and adapt the structures of the stamp blank in accordance with said precipitation when forming the surface of the stamp blank. Another reason why the metal layer should not be too thick is that cracks may arise in the metal layer during heating of the stamp if the stamp blank and the metal layer do not have the same coefficient of thermal expansion. Since the stamp is heated during the nano imprint process and the molding process, respectively, a thick metal layer and a difference regarding the coefficient of thermal expansion resulting in the formation of cracks would effect the useful life of the stamp negatively. The metal layer has a suitable thickness of 1-300 nm, more preferably 1-100 nm and 2-20 nm is most preferred.

It is suitable for some stamp blanks that the metal layer has such a thickness that it in the interface towards the surface of the stamp blank also after the oxidation is present in metallic form in order to provide good adhesion to said stamp blank. If the metal layer is too thin atoms of oxygen can roam through the metal layer down to the stamp blank and oxidise the same, which in some cases is negative for the adhesion of the metal layer to the surface of the stamp blank. In the case of e.g. titanium dioxide it has been shown that the titanium dioxide layer obtains a thickness of about 5 nm after oxidation in surrounding air according to the above. When the metal layer is a titanium layer it is often appropriate for the titanium layer to have a thickness exceeding 5 nm, preferably about 10 nm. A layer of aluminium oxide formed by oxidation in surrounding air has a thickness of at least about 2 nm. A layer of aluminium oxide has therefore a total appropriate thickness of at least about 5 nm.

In other cases, such as when a layer of titanium or aluminium is applied on a stamp blank of nickel, also the oxide, titanium dioxide or aluminium oxide in said case, will have a good enough adhesion to the stamp blank. In case of a titanium layer on a nickellic stamp blank the minimum thickness of the titanium layer is thus determined by the thickness required for the formed titanium dioxide layer to be durable enough and to cover the entire surface of the stamp blank. In case of a stamp blank of nickel the layer of titanium or aluminium should have a thickness of at least about 2 nm.

An anti-adhesive layer is thereafter attached to the oxidised metal layer. In a preferred embodiment of the invention a first and second reagent is used. The first reagent is bonded with the metal layer at a first reaction, wherein the second reagent is bonded to the first reagent at a second reaction. The reason for this embodiment to be preferred is that it is quite a simple task to find commercial compounds suitable to be used as a first and second reagent, respectively.

A first reagent to be used during the manufacturing of the stamp has at least two functional groups according to the invention. A first functional group has the purpose to bond with the surface of the metal layer. An example of such a first functional group is a silane group with the chemical formula $(BO)_{3-n}R'_nSi$—. The silane group can bond with the metal layer by means of a group B1 on the surface of the metal layer, wherein B1 usually is a M—O— or a M—OH where M is a metal atom comprised in the metal layer. In this application the wording "silane group" also means the above-mentioned group after being bonded with the stamp. The silane group may comprise n aliphatical groups R' and 3-n reactive bonding groups B0, where n=0, 1 or 2. B0 is suitably a group capable of hydrolysis. Suitable reactive bonding groups B0 are chlorine (Cl) or alcoxi groups, preferably $C_{1-4}$ alcoxi groups, more preferably $C_{1-2}$ alcoxi groups, such as ethoxy groups (EtO), methoxy groups (MeO). The aliphatic groups R' are preferably, to the extent they are present at all, short saturated aliphatical groups, preferably $C_{1-4}$ alkylical groups, even more preferable $C_{1-2}$ alkylical groups, such as ethyl groups and methyl groups. When n=1 or 2 and R' is a methyl group a smaller bonding area is obtained, e.g. the monomolecular layer can be packed with a higher density. The strongest bond with the surface is however obtained when n=0, e.g. when the silane group has three reactive bonding groups B0. An example of such a suitable first functional group is thus:

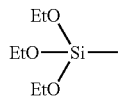

[first functional group in form of triethoxysilane]

Another example of a suitable first functional group is a phosphate group, —$H_2PO_4$.

The first reagent has a second functional group X1, preferably chosen so as to not react or only to a limited extent react with the surface of the metal layer. Such a functional group has the advantage that a homogeneous monomolecular layer having a well-defined group at one end is obtained when the surface of the metal layer is treated with the first reagent. A suitable group X1 is thus a group, which can not be hydrolysed. In addition, the group X1 should not react with the first functional group. Suitable groups of X1 are e.g. —SH, $NH_2$, and —OH. When X1 is a —$NH_2$-group or an —OH-group then B0 must not be chlorine, since this would cause undesirable reactions of polymerisation.

The first and second functional groups of the first reagent are advisably attached to opposite ends of a carbon compound R1. Such a carbon compound R1 is preferably a carbon chain, lacking branches or having only short branches, which advisably have a length of 1-6 carbon atoms, more preferably 1-3 carbon atoms. The carbon chain is advisably a saturated, aliphatical carbon chain. Non-saturated carbon chains may participate in undesirable side reactions and heavily branched or cyclic compounds occupy an unnecessary amount of space on the surface of the stamp, thereby reducing the density of the anti-adhesive functionality on this surface.

The second functional group X1 may effect the electron density in the nearest positioned atoms in the molecule, which can give rise to undesirable effects on the first functional group. It is therefore advisable that the R1 group is designed so as to "isolate" the group X1 from the first functional group from an electron density point of view. In case of aliphatical, saturated carbon chains the $CH_2$-group being closest to X1 is strongly effected, the next-coming $CH_2$-group effected to some extent while the third $CH_2$-group is substantially unaffected by X1. The group R1 is advisably not substituted in order not to effect the first and second functional groups in a negative way. R1 has thus advisably a length from the first to the second functional group of 1-10 carbon atoms, preferably 2-5 carbon atoms and most preferably 3 carbon atoms.

It is preferable to choose a first reagent that fulfils the above-described criteria and which is commercially available. Example of a preferred first reagent is thus mercaptopropyltriethoxysilane:

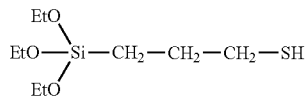

The second reagent comprises a first portion X2, supposed to bond with the X1-group of the first reagent, and a second portion R2, having an anti-adhesive functionality.

The group X2 can be chosen in order to be suitable for reacting with the X1-group present in the first reagent. The reaction shall result in a bond being strong enough to maintain the anti-adhesive functionality at the surface of the stamp. The bond, which is formed between X1 and X2, is, however, weaker than the rest of the bonds in the monomolecular layer. A possible break in the molecule chain will then take place at a predictable position, e.g. between X1 and X2. Examples of suitable combinations of X1 and X2 are: X1=—SH-group and X2=—SH-group, which can form a sulphur bridge, X1=$NH_2$-group and X2=Cl—(C=O)—, which can form a peptide bond, and X1=OH and X2=HO—(C=O)—, which can form an ester. Particularly preferable is that both X1 and X2 are —SH-groups, since these form a bond strong enough to maintain the anti-adhesive functionality, but is weaker than e.g. bonds between carbon atoms in the molecule chain, between carbon atoms and sulphur atoms and between a silane group and the surface of the stamp.

The group R2 preferably comprises fluorine atoms, which give the desired anti-adhesive functionality. Particularly advisable is that R2 has a free end group, comprising a carbon atom to which one or several fluorine atoms are bonded. The R2-group is preferably a fluorinated, aliphatical, saturated carbon chain. Unsaturated carbon chains can participate in undesirable side reactions and heavily branched or cyclical compounds occupy an unnecessary large amount of space, which reduces the density of the anti-adhesive functionality.

The fluorine atoms will effect the electron density in the nearest positioned atoms in the molecule, which can give undesirable effects for the bond between X2 and X1. It is therefore advisable that the R2-group is formed in such a way that it "isolates" the X2-group from the fluorine atoms from an electron density point of view. In case of aliphatical, saturated carbon chains the $CH_2$-group being closest to a carbon atom, which is substituted with fluorine, is strongly effected, while the next-coming $CH_2$-group is almost unaffected. The R2-group has advisably at least 1 and preferably 2 $CH_2$-groups in line nearest the X2-group. In case of longer chains of $CH_2$-groups the risk of breakage increases. The number of $CH_2$-groups in line should thus not be more than 5.

R2 has preferably at least one perfluorated carbon atom. This carbon atom is preferably the end group of the R2-group, e.g. a $CF_3$-group. Additional perfluorated carbon atoms give a better anti-adhesive functionality. Very long carbon chains increase the risk of breakage of the chain and also makes the anti-adhesive layer less stable, when the carbon chains can change their angle in relation to the surface. R2 has thus advisably 1-12 perfluorated carbon atoms, preferably 2-8 perfluorated carbon atoms and most preferably 3-6 perfluorated carbon atoms.

It is suitable to choose a second reagent that fulfils the above-described criteria and which is commercially available. Examples of such preferred second reagents are thus 1H, 1H, 2H, 2H-perfluorooctanethiol:

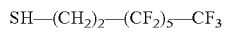

The oxidised metal layer is washed e.g. by using 1-4 organical solvents, e.g. trichloroethylene, ethanol, acetone and isopropanol, after each other. The stamp is thereafter treated with the first reagent. This first treatment can be performed either in a liquid phase or in a gas phase.

At a first treatment in a liquid phase the stamp is placed in a vessel for about 1-5 h, comprising about 0, 1-1% of the first reagent in an organical solvent, advisably an alkane not comprising water at room temperature. The stamp is thereafter washed advisably by using a series of 1-4 organical solvents similar to those mentioned above in order to remove such compounds which are not covalently bonded with the surface.

In a first treatment in a gas phase the stamp is placed in an oven having a nitrogen atmosphere comprising no water and a temperature of about 50-250° C., preferably about 150-220° C., and having a pressure at which the first reagent is present in a gas phase, usually a pressure of about 0.5-20 kPa, preferably about 1-3 kPa. The precise combination of temperature and pressure is chosen so that the first reagent will certainly be present in a gas phase. The first reagent is thereafter conveyed into the oven, e.g. by using a syringe, where it is evaporated and is left to react with the stamp for about 0.5-10 h. The stamp is thereafter removed from the oven and is left to cool down and is thereafter washed with a series of organical solvents according to the description above.

The gas phase reaction is much more complicated to perform than the relatively simple liquid phase reaction. The gas phase reaction, however, often gives a much more homogenous monolayer on the surface of the stamp and is therefore to prefer in many cases.

In case of a stamp blank having a metal layer of titanium and the above-mentioned preferred first reagent can thus the following result be obtained after the first treatment:

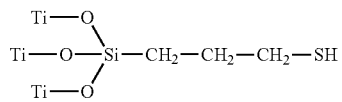

The bond between the metal layer and the actual structure of the silane group and the residue product, ethane of ethanol in the above example, may be effected to some extent depending on the original structure of the surface. The bond between the titanium surface and the silane group is assumed to look like $(Ti)_3Si$ or $(Ti-O)_3Si$, but the precise appearance is not completely established. The above formulas thereby intend to denote a silane group bonded with a metal surface independently of the precise appearance of the actual bond.

The washed stamp is thereafter treated with the second reagent. This second treatment can be carried out either in a liquid phase or in a gas phase.

In a second treatment being carried out in a liquid phase the stamp is placed in a vessel comprising a suitable solvent, e.g. an alkane comprising no water, with about 0.1-5% of the second reagent at room temperature. The reaction is left to proceed for about 6-24 h and the stamp is thereafter taken up and made clean by inserting it in one or several baths in a suitable, organical solvent, e.g. the above-mentioned alkane. The stamp is thereafter dried and then ready to use for nano imprinting.

In a second treatment being carried out in a gas phase the stamp is placed in an oven with a nitrogen atmosphere comprising no water and having a temperature of about 50-200° C., preferably about 70-120° C. The oven is evacuated to a low pressure, suitably about 1-20 kPa, even more preferably about 5-10 kPa. The precise combination of temperature and pressure is chosen in such a way so that the second reagent for certain will be present in a gas phase. The second reagent is then conveyed into the oven, e.g. by using a syringe, where it is evaporated and reacts for about 1-10 h with the mono layer on the surface of the stamp. The stamp is removed from the oven, is left to cool down and is thereafter made clean in the same way as described above and is thereafter ready to use for nano imprinting.

At the second treatment, the surface of the stamp is covered with a monomolecular layer from the beginning. Therefore, a gas phase reaction does usually not give any advantage regarding the homogeneity of the layer. The reaction in a liquid phase is much less complicated to perform and is therefore normally to prefer at the second treatment. In case of very small nano structures a gas phase reaction is sometimes required to obtain a resulting layer having a thickness being homogeneous enough, after the reaction.

In a reaction between the above described product after the first treatment and the above described preferred second reagents can thus the following result be obtained after the second treatment when the X1- and X2-groups have reacted and formed a group Q in form of S—S:

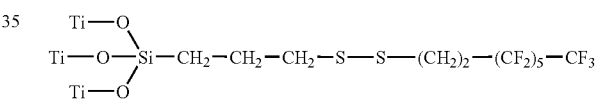

When the first functional group is a phosphate group in stead of a silane group can e.g. a first reagent in form of a mercaptopropylphosphoric acid be used:

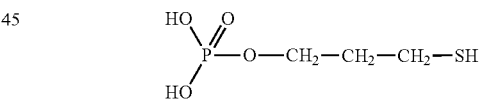

When the first reagent has been attached to the metal layer according to any of the above described procedures, the above-mentioned second reagent 1H, 1H, 2H, 2H-perfluorooctanethiol can be used in a second treatment as described above in order to obtain the following anti-adhesive layer on the surface of the metal layer (Me in the formula below denotes a simple metal, such as Ti):

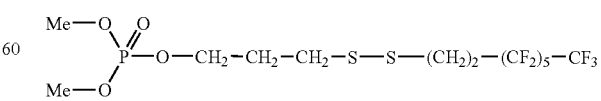

One way to attach a phosphate group to a metal oxide is described in "Surface Modifications for optical Biosensor Applications" by Rolf Hofer, Diss. ETH No. 13873, Zürich 2000. According to this document the metal oxide is treated with an organical solvent comprising phosphate groups, wherein the phosphate groups are chemically bonded with the metal oxide.

In another embodiment the anti-adhesive layer is formed by directly attaching a ready molecule chain on the surface of the stamp, e.g. a molecule chain comprising a group capable of bonding with the surface of the stamp and at least a fluorine-comprising group. A ready molecule chain means that the anti-adhesive layer is attached to the surface of the stamp in a single step, which facilitates the practical operation. Attaching a complete ready molecule chain in one single step is carried out in substantially the same way and under the same conditions as have been described above for the first treatment. The resulting anti-adhesive layer can in a metal layer of titanium e.g. obtain the following appearance:

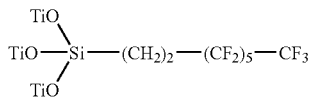

A suitable manufacturing process for a stamp can thus comprise the following steps:

a) a nickellic stamp blank is provided with a nano pattern on its surface in a known way b) the stamp blank is washed in a known way with a mixture comprising 15 vol-% $NH_3$, 70 vol-% $H_2O$ and 15 vol-% $H_2O_2$ and is thereafter dried c) the stamp blank is placed in a vacuum oven, wherein evaporated metal is furnished and precipitated on the surface of the stamp d) the stamp thereby equipped with a metal layer is taken out of the oven, wherein the surface of the metal layer is brought to oxidise by contact with filtered surrounding air e) the oxidised metal layer of the stamp is provided with an anti-adhesive layer by a reaction in one or several steps f) the stamp is washed in a known way using a series of organical solvents, thereafter dried and is then ready for use e.g. for nano-imprint lithography or for molding objects with nano patterns.

There are also other ways to manufacture a stamp according to the invention. One possibility is to use a molecule, which has a carboxyl group as a first functional group instead of the above-mentioned phosphate- and silane groups. The carboxyl group, however, does not bond with an oxidised metal layer of aluminium or titanium in a stable enough way. If the surface of the metal layer on the other hand is treated with a thin layer (corresponding to a single or a couple of atom layers) of zirconium oxide the bond of the carboxyl groups will become very good and a strong anti-adhesive layer can be obtained. A layer of zirconium oxide can also be used in order to strengthen the bond of phosphate groups on a metal layer of $TiO_2$ or $Al_2O_3$. A layer of zirconium oxide can for instance be precipitated on the metal layer of $TiO_2$ or $Al_2O_3$ by putting the stamp in a reaction chamber being evacuated down to 0.013 Pa. Distilled (t-butyl-O)$_4$ Zr is furnished to the reactor. When a zirconium layer with a desired thickness has been obtained on the stamp the stamp is taken out from the reactor, it is washed and treated as described above with a suitable reagent for the formation of an anti-adhesive layer.

Another possibility to manufacture a stamp according to the invention is to treat the oxidised metal layer with a super critical liquid comprising a suitable molecule, e.g. any of the above described reagents, in a solution. Such a liquid is super critical $CO_2$. The low viscosity and the high rate of diffusion of super critical $CO_2$ makes it easy for the reagent to be transported into the structured nano scaled patterns of the stamp and bond with the oxidised metal layer. For instance can a large surplus of a suitable molecule, e.g. any of the described reagents, be dissolved in a pressure reactor with super critical $CO_2$ at a pressure of 7500 psi (500 bar) and a temperature of 150° C. The stamp is placed in the pressure reactor for a few minutes. The stamp equipped with a monemolecular layer is thereafter taken out of the pressure reactor and washed in a following step using a suitable solvent.

A less preferable possibility is to dip the stamp equipped with the oxidised metal layer in a solution comprising a suitable molecule, e.g. any of the above described reagents. A solvent that can be used is tetrahydrofurane (THF). Dipping into a solvent is however very sensitive to possible residues of water in the solvent and the risk is quite extensive that the anti-adhesive layer will not get the desired quality. The consumption of reagents often gets quite large.

The anti-adhesive layer is advisably monomolecular. However, in some cases, a layer can be used having a certain polymerisation on the surface of the layer.

DETAILED DESCRIPTION OF A PREFERRED EMBODIMENT

Figure 2:
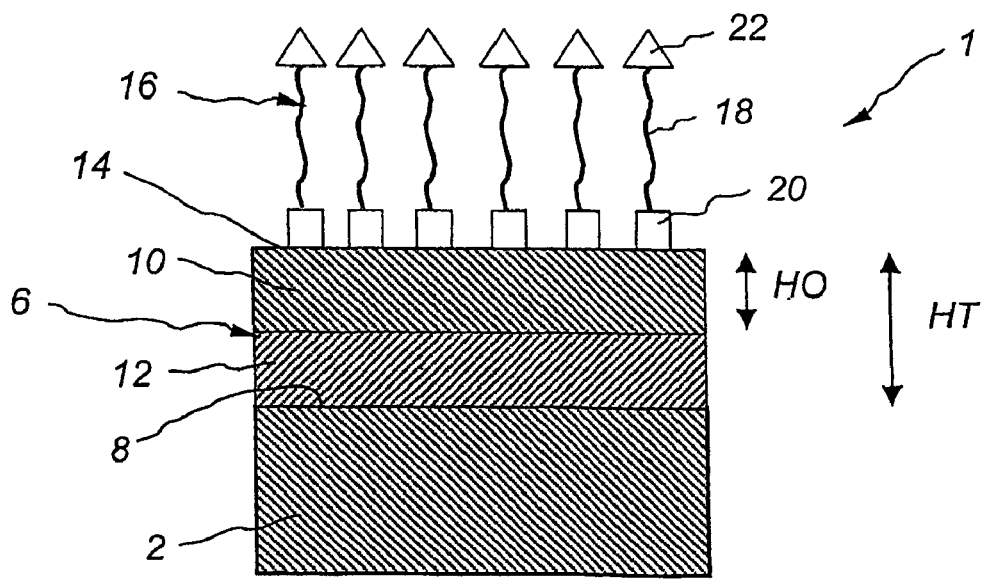
FIG. 2 is an enlargement of the portion II shown in FIG. 1 and shows the metal layer with an anti-adhesive layer attached thereon.

FIG. 1 shows a stamp 1 to be used for nano-imprint lithography. The stamp 1 has a stamp blank 2 of nickel. The stamp blank 2 has been manufactured by electroplating of a structured silicon disk and thereby obtained a number of protrusions, in FIG. 1 schematically shown as one protrusion having a height HU of about 200 nm and a width BU of about 200 nm. A titanium layer 6 has been applied on the surface 8 of the stamp blank 2 by the above-described evaporation in vacuum. The titanium layer 6 has a total thickness HT of 10 nm. The titanium layer 6 has formed an oxide film 10 when in contact with the filtered surrounding air, as is best seen in FIG. 2. The oxide film 10 has a thickness HO of about 5 nm. Under the oxide film 10 titanium is still present in a metallic form and forms a metallical layer 12, which holds the titanium layer 6 to the surface 8 of the stamp.

On the surface 14 of the oxide film 10 exposed to the surroundings there is a monomolecular anti-adhesive layer, in FIG. 2 schematically illustrated as 16. The anti-adhesive layer 16 has been manufactured by means of the above first and second treatments. Each molecule 18 in the anti-adhesive layer 16 thus comprises a silane group 20, bonded with the oxide film 10, and a group comprising fluorine, in FIG. 2 schematically illustrated as 22.

When the stamp 1 is used to imprint a pattern in a DVD blank 24 of polycarbonate both the stamp 1 as well as the DVD blank 24 are heated, wherein the protrusions 4 are pressed into the soft blank 24. The fluoronized alkyl groups 22 do not attach to the stamp 24 and give thus the effect that the stamp 1 after the imprint process can be released from the blank 24 quite easily without sticking to it.

It is understood that many modifications of the above-described embodiment are possible within the scope of the invention as defined by the following claims. Thus the method and the mold tool can be used for the manufacturing of a wide range of nano scale structures. The mold tool can either be pressed into a substrate on an object or be used as an integral part of a mold in which a structured nano scale pattern is to be molded. Integrated circuits, micro scale devices, magnetic storage media and optical storage media constitute non-limiting examples of such objects. Examples of optical storage media are, in addition to the above-mentioned CDs and DVDs, also future generations optical storage media. These storing media are expected to have much smaller structures than for instance DVDs and will thus require less adhesion between the mold tool and for instance a polymer on the surface of the medium.

Example 1

A stamp blank of nickel was used to make a stamp blank, which stamp blank was provided by electro-plating of a structured silicon disc for forming a structured nano scale pattern suitable for the production of optical storage media, such as CDs and DVDs. The pattern had protrusions with a typical width of 200-600 nm and a height of 150 nm. The stamp blank was washed with a mixture comprising 15 vol-% $NH_3$, 70 vol-% $H_2O$ and 15 vol-% $H_2O_2$. The stamp blank was thereafter placed in an oven, which was evacuated to a pressure of 0.013 Pa. The oven was thereafter furnished with evaporated titanium during measurement of the thickness of the titanium layer on the stamp blank. When the layer had a thickness of about 10 nm the treatment was stopped and the stamp equipped with a titanium layer was taken out of the oven. When the stamp was taken out into the air of the room an almost immediate oxidation of the surface of the titanium layer took place.

The stamp was thereafter washed with organical washing means in three steps comprising substances in the following order trichloroethylene, acetone and isopropanol. Each step had a duration of about 1 minute. The stamp was thereafter dried in nitrogen atmosphere.

The stamp was thereafter brought into a so-called glove box filled with nitrogen gas at atmospheric pressure. The concentration of both oxygen gas, $O_2$, as well as vapor, $H_2O$, was under 1 ppm in the glove box. The stamp was placed in a petri dish, which had a volume of 20 ml. The petri dish had been passivated beforehand by treatment with dimethyl-dichloro-silane (10% solution in dichloro methane) in order not to react with the furnished reagent. The petri dish was placed on a heating plate in the glove box, wherein a temperature of 250° C. was tuned in for the heat plate. 10 μl of tridecafluoro-(1,1,2,2)-tetrahydrooctyl-trichloro silane (also called $F_{13}$—TCS), was injected into the petri dish, evaporated and was thereafter left to react with the stamp during 2 hours. The stamp was thereafter taken out of the oven, was left to cool down, was washed with hexane in three consecutive baths and was thereafter dried with nitrogen gas.

The stamp was thereafter used for nano-imprint lithography for transferring a pattern to a plate covered with a layer of thermoplastic. No adhesion of thermoplastic to the stamp could be detected.

Example 2

A stamp was equipped with a titanium layer and was washed in accordance with Example 1. The washed stamp was brought into a glass reactor (standard glass reactor from Schott GmbH, DE), which had been passivated beforehand by using dimethyl-dichloro silane according to the description above. Pure nitrogen gas (99.99%) was furnished through one of the reactor openings and was left to flush through the reactor, wherein nitrogen gas and remaining air were flushed out through another opening. After flushing for 10 minutes the reactor was evacuated to a pressure of <100 Pa in order to further decrease the amount of oxygen and water steam. The evacuated reactor was heated to 250° C. in a heat bath and thereafter 10 μl $F_{13}$—TCS was furnished through an inlet. The stamp was taken out from the reactor after 2 hours and was after the corresponding wash according to the one in Example 1 ready to use.

Example 3

A stamp was provided with a titanium layer and washed according to Example 1. The washed stamp was placed in a cup. The cup comprised a huge surplus of $F_{13}$—TCS in water free hexane. After 16 hours at 50° C. the stamp was taken out and washed with hexane in three consecutive baths and was thereafter dried with nitrogen gas.

In trials with nano-imprint lithography similar to the trials in Example 1 some deformation of the thermoplastic of the structure of the plate could be observed. This implies that the anti-adhesive layer did not become completely smooth, probably due to some polymerisation caused by water residues.

The invention claimed is:

1. A method for manufacturing a mold tool adapted to be used for forming a structured nano scale pattern on an object and having a layer, which is anti-adhesive with regard to the object, said method comprising the following steps:
   providing a stamp blank with a structured pattern on a surface,
   depositing a layer of a metal chosen from titanium, zirconium, niobium, tantalum, and aluminium, and mixtures thereof, on the patterned surface, said metal having a stable oxidation number,
   oxidising the layer of metal to form a mechanically stable oxide film, and
   applying at least one reagent on the oxide film, said reagent comprising molecule chains, each having a linkage group, which is chemically bonded with the oxide film, wherein the molecule chains either from the beginning comprise at least one group comprising fluorine, or are provided with at least one such group in a subsequent treatment.

2. The method of claim 1 wherein said linkage group is chemically bonded by a covalent bond with said oxide film.

3. The method according to claim 1, wherein said linkage group is chosen among silane groups, phosphate groups and carboxylic groups.

4. The method according to above claim 1, wherein the metal is furnished to the pattern equipped surface in an evaporated form.

5. The method according to above claim 1, wherein the layer of metal is oxidised by bringing it in contact with a gas comprising oxygen, such as surrounding air, filtered surrounding air, or a synthetical gas mixture comprising oxygen.

6. The method according to claim 1, wherein the patterned surface is coated with a layer of metal with a thickness (HT) of 1-300 nm.

7. The method according to any one of claims 1, 2, 3, and 4, wherein the patterned surface is coated with a layer of metal with a thickness (HT) of 1-100 nm.

8. A mold tool adapted to be used for forming a structured nano scale pattern on an object, comprising:
   a stamp blank having a structured pattern on its surface,
   a layer of metal disposed on the surface, the layer of metal comprising at least one of aluminium, zirconium, tantalum, niobium, and titanium,
   a mechanically stable oxide film on the layer of metal, the oxide film comprising an oxide of said at least one of aluminium, zirconium, tantalum, niobium, and titanium, wherein the oxide film is formed by oxidizing the metal layer, and
   an anti-adhesive layer, which is anti-adhesive with regard to the object, comprising at least one reagent on the oxide film, said reagent comprising molecule chains, each having at least one linkage group and at least one group comprising fluorine, which is chemically bonded with the oxide film, and wherein the molecule chains either from the beginning comprise at least one group comprising fluorine, or are subsequently provided with at least one such group.

9. The mold tool according to claim 8 wherein said at least one linkage group is chemically bonded by a covalent bond with said oxide film.

10. The mold tool according to claim 8, wherein said layer of metal has a thickness (HT) of 1-300 nm.

11. The mold tool according to claim 8, wherein said layer of metal has a thickness (HT) of 1-100 nm.

12. The mold tool according to claim 8, wherein said stamp blank comprises a metal and/or silicon.

13. The mold tool according to claim 12, wherein said stamp blank comprises nickel.

* * * * *

UNITED STATES PATENT AND TRADEMARK OFFICE
CERTIFICATE OF CORRECTION

PATENT NO.       : 7,687,007 B2                                  Page 1 of 1
APPLICATION NO.  : 10/518475
DATED            : March 30, 2010
INVENTOR(S)      : Torbjörn Ling et al.

It is certified that error appears in the above-identified patent and that said Letters Patent is hereby corrected as shown below:

On the Title Page, Item (54), & Column 1 line 1: in the Title, "MOLD FOR NANO IMPRINTING" should read --MOLD TOOL METHOD OF MANUFACTURING A MOLD TOOL AND STORAGE MEDIUM FORMED BY USE OF THE MOLD TOOL--.

On the Title Page, after Item (60), Related U.S. Application Data, insert

--(30)              Foreign Application Priority Data
June 20, 2002       (SE).....................................0201917-2--.

Signed and Sealed this

Thirteenth Day of September, 2011

David J. Kappos
*Director of the United States Patent and Trademark Office*